United States Patent
Hwang et al.

(10) Patent No.: US 8,497,570 B2
(45) Date of Patent: Jul. 30, 2013

(54) WAFER, FABRICATING METHOD OF THE SAME, AND SEMICONDUCTOR SUBSTRATE

(75) Inventors: Sun-Ha Hwang, Yongin-si (KR);
Young-Soo Park, Yongin-si (KR);
Sam-Jong Choi, Suwon-si (KR);
Joon-Young Choi, Suwon-si (KR);
Tae-Hyoung Koo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 191 days.

(21) Appl. No.: 13/178,919

(22) Filed: Jul. 8, 2011

(65) Prior Publication Data
US 2012/0056304 A1 Mar. 8, 2012

(30) Foreign Application Priority Data
Sep. 3, 2010 (KR) .................. 10-2010-0086716

(51) Int. Cl.
*H01L 29/36* (2006.01)

(52) U.S. Cl.
USPC ............ 257/655; 257/E29.002; 257/E21.466; 257/E21.135; 438/549; 438/542; 438/369

(58) Field of Classification Search
USPC .. 438/369, 542, 181, 510, 514, 549; 257/655, 257/E29.002, E21.466, E21.135
See application file for complete search history.

(56) References Cited

U.S. PATENT DOCUMENTS
6,812,523 B1  11/2004  Chu et al.

FOREIGN PATENT DOCUMENTS
| | | |
|---|---|---|
| JP | 2002064102 A | 2/2002 |
| KR | 19990024037 | 3/1999 |
| KR | 20100006906 A | 1/2010 |

*Primary Examiner* — David Vu
(74) *Attorney, Agent, or Firm* — Harness, Dickey & Pierce, P.L.C.

(57) ABSTRACT

A wafer, a fabricating method of the same, and a semiconductor substrate are provided. The wafer includes a first substrate layer formed at a first surface, a second substrate layer formed at a second surface opposite to the first surface, the second substrate layer having a greater oxygen concentration than the first substrate layer, and an oxygen diffusion protecting layer formed between the first substrate layer and the second substrate layer, the oxygen diffusion protecting layer being located closer to the first surface than to the second surface.

18 Claims, 9 Drawing Sheets

WAFER, FABRICATING METHOD OF THE SAME, AND SEMICONDUCTOR SUBSTRATE

CROSS-REFERENCE TO RELATED APPLICATION

This application claims priority from Korean Patent Application No. 10-2010-0086716 filed on Sep. 3, 2010 in the Korean Intellectual Property Office, and all the benefits accruing therefrom under 35 U.S.C. 119, the entire contents of which are herein incorporated by reference.

BACKGROUND

1. Field

Example embodiments relate to a wafer, a fabricating method of the same and/or a semiconductor substrate, and more particularly to a wafer having improved device reliability, a fabricating method of the wafer, and a semiconductor substrate.

2. Description of the Related Art

Along with the continuous development of semiconductor devices, the design dimension of the semiconductor device is gradually becoming increasingly integrated and miniaturized to a level of several tens of nanometers. The miniaturization of the semiconductor device undesirably degrade the reliability of the fabricated device due to diffusion of impurity remaining in the Si wafer, for example, oxygen, into a surface of the device, in the course of fabricating the device.

SUMMARY

Some example embodiments provide a wafer and a semiconductor substrate having improved device reliability, and/or a fabricating method of the wafer. These and other objects of the inventive concepts will be described in or be apparent from the following description of example embodiments.

According to an example embodiment, a wafer includes a first substrate layer formed at a first surface, a second substrate layer formed at a second surface opposite to the first surface, the second substrate layer having a greater oxygen concentration than the first substrate layer, and an oxygen diffusion protecting layer formed between the first substrate layer and the second substrate layer, the oxygen diffusion protecting layer being located closer to the first surface than to the second surface.

According to another example embodiment, a wafer includes a first substrate layer formed at a first surface on which an active region of an integrated circuit device is formed, a second substrate layer formed at a second surface opposite to the first surface, the second substrate layer having a greater thickness than the first substrate layer, and a high-concentration boron layer formed between the first substrate layer and the second substrate layer.

According to yet another example embodiment, a semiconductor substrate includes a high-concentration boron layer formed to a depth of 3 to 10 μm from a front surface of a wafer.

According to still another example embodiment, a fabricating method of a wafer includes providing a bare wafer by cutting a single crystalline silicon ingot, the bare wafer including a first surface on which an active region of an integrated circuit device is formed and a second surface opposite to the first surface, diffusing boron into the bare wafer through the first surface by performing a first thermal process, and forming a high-concentration boron layer closer to the first surface than to the second surface by performing a second thermal process.

According to yet another example embodiment, a wafer includes an oxygen diffusion protecting layer formed in a substrate having a first surface on which an integrated circuit device is formed, and a second surface opposite to the first surface, the substrate having an oxygen concentration that is greater between the oxygen diffusion protecting layer and the second surface of the substrate than between the oxygen diffusion protecting layer and the first surface of the substrate.

BRIEF DESCRIPTION OF THE DRAWINGS

The above and other features and advantages of example embodiments will become more apparent by describing in detail preferred embodiments thereof with reference to the attached drawings in which.

DETAILED DESCRIPTION

Figure 1:
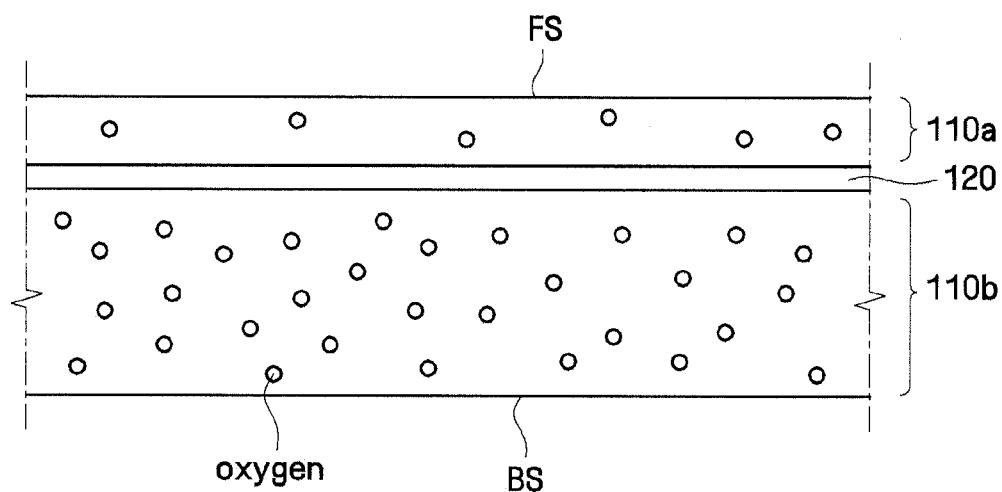
FIG. 1 is a cross-sectional view for explaining a wafer according to an example embodiment.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the size and relative sizes of layers and regions may be exaggerated for clarity.

Like numbers refer to like elements throughout. As used herein, the term "and/or" includes any and all combinations of one or more of the associated listed items. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
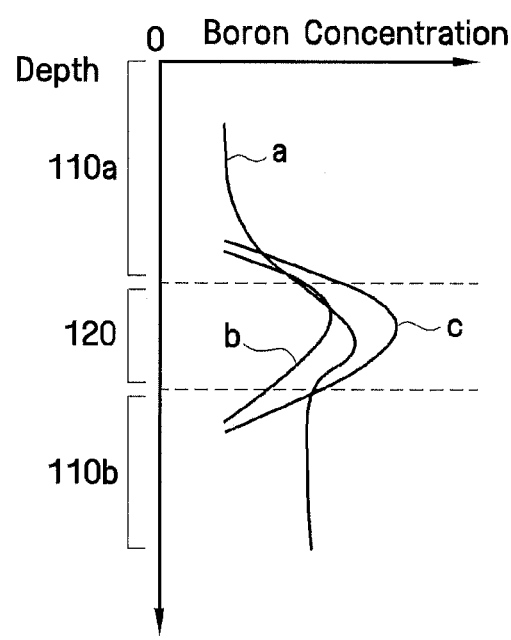
FIG. 2 is a graph illustrating a change in the impurity concentration depending on depths of the wafer shown in FIG. 1.
Figure 3:
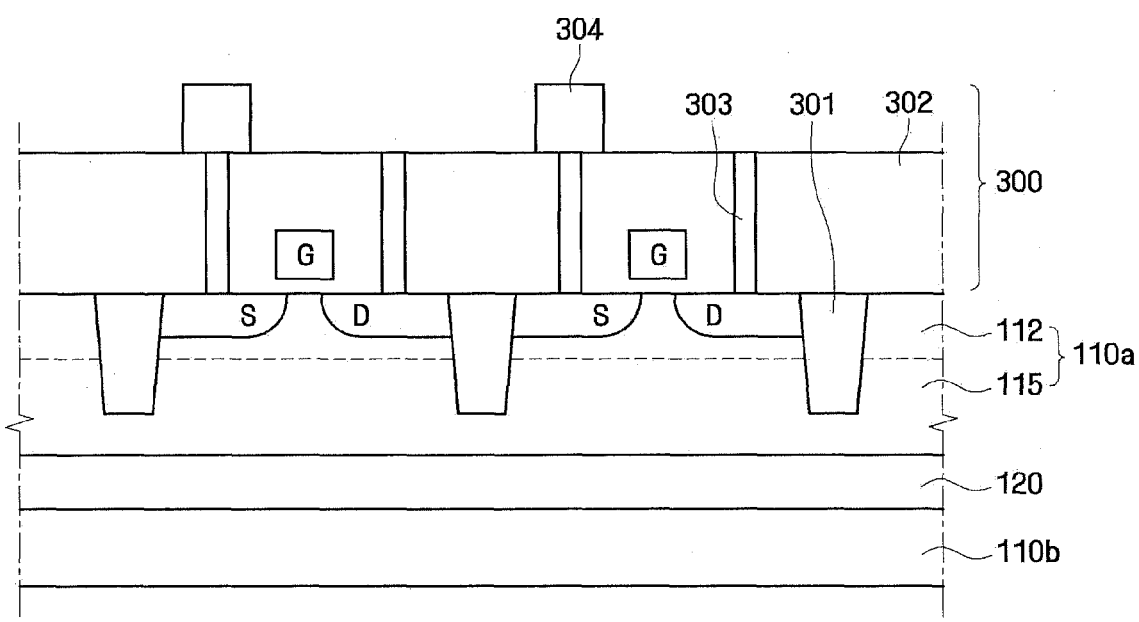
FIG. 3 is a cross-sectional view for explaining an example case where functional elements of a semiconductor device are formed on the wafer shown in FIG. 1.

Hereinafter, a wafer according to an example embodiment will be described with reference to FIGS. 1 through 3 will be described. FIG. 1 is a cross-sectional view for explaining a wafer according to an example embodiment, FIG. 2 is a graph illustrating a change in the impurity concentration depending on depths of the wafer shown in FIG. 1, and FIG. 3 is a cross-sectional view for explaining an example case where functional elements of a semiconductor device are formed on the wafer shown in FIG. 1.

Referring to FIG. 1, the wafer according to the example embodiment includes a first substrate layer 110*a*, a second substrate layer 110*b*, and a high-concentration boron layer 120.

The first substrate layer 110*a* is a region at a first surface, e.g., a front surface (FS), of the wafer, and the second substrate layer 110*b* is a region at a second substrate layer opposite to the first surface, e.g., a back surface (BS) of the wafer. The high-concentration boron layer 120 is formed between the first substrate layer 110*a* and the second substrate layer 110*b*.

Here, the high-concentration boron layer 120 may be defined as a region having a higher boron concentration than the surrounding region. More specifically, a first boron concentration of the high-concentration boron layer 120 is higher than a second boron concentration of the first substrate layer 110*a* and a third boron concentration of the second substrate layer 110*b*.

In addition, the first substrate layer 110*a* and the second substrate layer 110*b* are separately defined in the specification in order conceptually distinguish regions at the front surface FS and the rear surface BS in view of the high-concentration boron layer 120. Accordingly, the first substrate layer 110*a* and the second substrate layer are not to represent different layers but are applied to one of a plurality of wafers acquired when cutting a silicon ingot, which will later be described. Notably, the first substrate layer 110*a* and the second substrate layer 110*b* are not complex layers, which are separately formed through different processes.

As shown in FIG. 1, the high-concentration boron layer 120 may be formed closer to the first surface, i.e., the front surface FS, than to the second surface, i.e., the back surface BS. That is to say, a thickness of the first substrate layer 110*a* may be smaller than that of the second substrate layer 110*b*. Alternatively, a depth from the front surface FS to the high-concentration boron layer 120 may be smaller than that from the back surface BS to the high-concentration boron layer 120.

In addition, as described above, the front surface FS may be a surface on which an active region of a semiconductor device is formed, and the back surface BS may be a surface opposite to the front surface FS. In other words, functional elements of the semiconductor device, for example, transistors, may be formed on the front surface FS.

The high-concentration boron layer 120 may demonstrate gettering capability for copper ions induced into substrate layers 110*a* and 110*b* while lowering oxygen diffusivity from the first and second substrate layers 110*a* and 110*b*. Thus, the high-concentration boron layer 120 may also be referred to as an oxygen diffusion protecting layer.

As shown in FIG. 2, impurity concentrations may change depending on the depth of the bare wafer 100. In the graph shown in FIG. 2, the abscissa indicates the impurity concentration, and the ordinate indicates the wafer depth. As the value of the abscissa shifts leftwards, the impurity concentration gradually increases. As the value of the ordinate shifts downwards, the wafer depth from the front surface FS gradually increases.

Referring to FIG. 2, a boron concentration (c) is highest in the high-concentration boron layer 120. Assuming that the number of silicon particles forming a wafer is about $5 \times 10^{21}$ atom/cm$^3$, the number of boron particles forming a wafer is greater than or equal to $1 \times 10^{17}$/cm$^3$, for example, in a range of about $1 \times 10^{18}$/cm$^3$ to about $1 \times 10^{19}$/cm$^3$. Accordingly the boron concentration (c) is highest in the high-concentration boron layer 120.

As shown, the boron concentration(c) shows a peak value in the high-concentration boron layer 120 and has relatively small values in the first substrate layer 110*a* and the second substrate layer 110*b*. Therefore, a BxOy complex, which will later be described, may be formed in the high-concentration boron layer 120 including the relatively high-concentrated boron ions distributed, thereby effectively preventing or reducing oxygen from being diffused into the front surface of the wafer.

An oxygen concentration (a) is highest in the high-concentration boron layer 120. That is to say, a first oxygen concentration of a region close to the front surface FS of the wafer, that is, the first substrate layer 110*a*, of the wafer in view of the high-concentration boron layer 120, and a first oxygen concentration of a region close to the rear surface RS of the wafer, that is, the second substrate layer 110*b*, may be relatively low.

In other words, the oxygen concentration (a) is lowest in the first substrate layer 110*a* having the front surface FS of the wafer and highest in the high-concentration boron layer 120. However, the oxygen concentration (a) is higher in the second substrate layer 110*b* having the back surface BS of the wafer than in the first substrate layer 110*a* and lower than in the high-concentration boron layer 120.

The reason of the foregoing is that the high-concentration boron layer 120 prevents or reduces oxygen contained in the second substrate layer 110b from being diffused into the first substrate layer 110a due to the reduced oxygen diffusivity, as described above. In other words, the oxygen ions contained in the second substrate layer 110b are prevented or reduced from being diffused into the first substrate layer 110a by the high-concentration boron layer 120. The prevention or reduction of diffusion is attributable to formation of a BxOy complex by boron ions contained in the high-concentration boron layer 120 and oxygen diffused into the high-concentration boron layer 120. Accordingly, preventing or reducing oxygen from being diffused into the first substrate layer 110a or to a region close to the front surface of the wafer is possible. That is to say, oxygen diffusivity can be effectively reduced by the high-concentration boron layer 120.

In a case where oxygen exists in the wafer, a silicon lattice defect that may be created in the course of fabricating a semiconductor device, for example, a vacancy, may become a vacancy-oxygen defect in a subsequent thermal process. The vacancy-oxygen defect may cause current leakage, resulting in degradation in the device characteristic and reliability.

In particular, in any case where such a defect is created in the vicinity of the front surface FS of a wafer, specifically a semiconductor substrate, device characteristics may deteriorate. Therefore, in the wafer according to the illustrated example embodiment, in the fabricating process of the semiconductor device, oxygen is prevented or reduced from being diffused into the front surface FS of the wafer, thereby fabricating the semiconductor device having improved reliability.

Referring back to FIG. 2, a copper concentration (b) is also highest in the high-concentration boron layer 120. As described above, when the wafer is a p-type wafer, copper ions induced into the wafer bond with boron ions to form a CuB compound. In this case, since a bond between the copper ions and the boron ions has high energy due to a coulomb pair bond, the high-concentration boron layer 120 may have effective copper ion gettering capability. Accordingly, the first copper concentration of the high-concentration boron layer 120 is higher than a second copper concentration of the first substrate layer 110a and a third copper concentration of the second substrate layer 110b.

As shown in FIGS. 1 and 2, the high-concentration boron layer 120 may be formed to a depth of about 3 to 10 μm from the front surface FS.

As described above, since the high-concentration boron layer 120 includes not only the boron-oxygen complex and the boron-copper complex but also highly concentrated boron impurity, the high-concentration boron layer 120 may be formed to a depth so as not to influence characteristics of the device to be formed on the front surface FS of the wafer.

In more detail, referring to FIG. 3, functional elements of the semiconductor device may be formed on the front surface FS. As shown, the first substrate layer 110a of the wafer 100 may include a device formation region 112 and a buffer region 115. That is to say, the functional elements of the semiconductor device is formed in the device formation region 112 of the first substrate layer 110a,and the buffer region 115 may be interposed between the high-concentration boron layer 120 and the device formation region 112 for ensuring device characteristics and reliability.

As described above, in order to protect the semiconductor device formed on the front surface FS of the wafer from various impurities included in the high-concentration boron layer 120, the buffer region 115 may be formed to an appropriate thickness. For example, the buffer region 115 may be formed to a thickness of about 2 μm, which is, however, provided only for illustration. The buffer region 115 may have a smaller thickness as long as the buffer region 115 has enough thickness to ensure the reliability of the device formed on the front surface FS of the wafer.

Further, a semiconductor device 300 can be applied to the wafer according to example embodiments, and may include a memory device including a MOS transistor formed on the semiconductor substrate, a NOR or NAND flash memory device, a multi-chip package (MCP) in which the aforementioned semiconductor devices are stacked, or all types of semiconductor devices using a wafer, such as solar cells. The semiconductor device may include isolation regions 301, source and drain regions S and D, gate electrodes G, an insulation layer 302, conductive plugs 303, and conductive lines 304. The isolation regions protrude downward into the buffer region 115 of the first substrate layer 110a from the bottom surface of the semiconductor device 300. The source and drain regions S and D are adjacent to the isolation regions 301 and located within the device formation region 112 of the first substrate layer 110a.The insulation layer 302 is located above and on the device formation region 112 of the first substrate layer 110a.The gate electrodes G are located within the insulation layer 302. The conductive plugs 303 are located within the insulation layer 302, and adjacent to the gate electrodes G. At least some of the conductive plugs 303 are electrically connected to the conductive lines 304 and the source and drain regions S and D.

In addition, the wafer according to example embodiments may be applied to a semiconductor substrate substantially in the same manner. That is to say, a semiconductor substrate including a high-concentration boron layer formed to a depth of about 3 to 10 μm from the front surface FS.

As described above, in the wafer and semiconductor substrate according to example embodiments, since the high-concentration boron layer is formed to a predetermined or given depth from the front surface of the wafer, the high-concentration boron layer may serve not only as a gettering layer for metal ions in the wafer but also as an oxygen diffusion protecting layer, thereby further improving the reliability of the semiconductor device.

Figure 4:
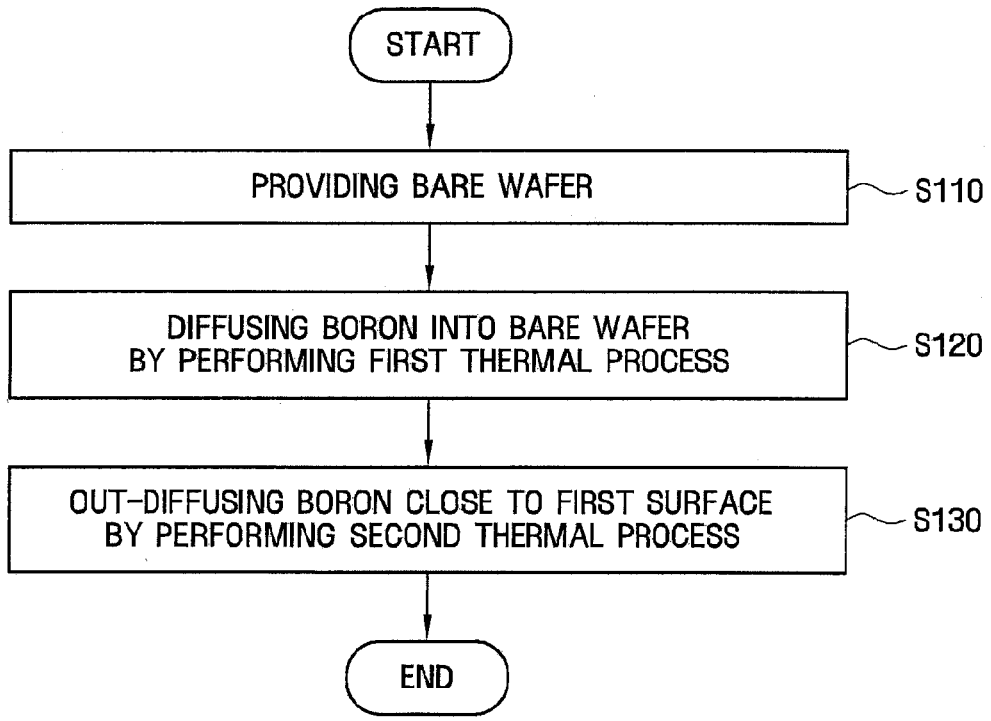
FIG. 4 is a flowchart for explaining a fabricating method of a wafer according to an example embodiment.

Hereinafter, a fabricating method of a wafer according to an embodiment of the present invention will be described with reference to FIGS. 4 through 9. FIG. 4 is a flowchart for explaining a fabricating method of a wafer according to an example embodiment, and FIGS. 5 through 9 are a cross-sectional view of an intermediate product for explaining the fabricating method of a wafer according to an example embodiment and graphs illustrating a change in the impurity concentration depending on depths of the wafer shown in FIG. 1.

Figure 5:
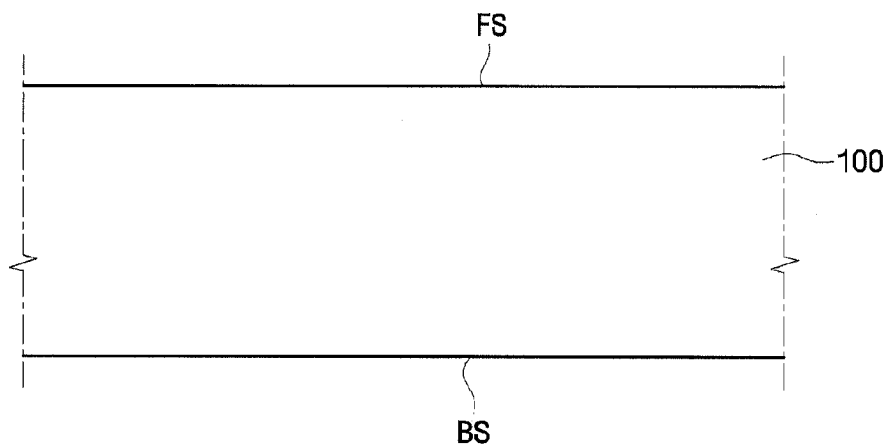
FIGS. 5 through 9 are a cross-sectional view of an intermediate product for explaining the fabricating method of a wafer according to an example embodiment and graphs illustrating a change in the impurity concentration depending on depths of the wafer shown in FIG. 1.

Referring first to FIGS. 4 and 5, a plurality of bare wafers are provided by cutting a single crystalline silicon ingot (S110). In detail, polysilicon is melted, and the single crystalline silicon ingot having the same crystallinity may be formed by a Czochralski method or a floating zone method. Here, in order to obtain desired electrical properties, impurities may be added. For example, in order to form a p-type wafer, a dopant such as boron, phosphorus, arsenic, antimony, or the like, may be added. Of course, elements other than the listed herein may be added.

The single crystalline silicon ingot is cut to provide the bare wafer 100. Here, the cutting of the single crystalline silicon ingot may be performed using a diamond or a wire.

Then, a multi-step process for polishing the cut wafer 100 may be performed. For example, an edge grinding step of rounding the edge of the wafer 100, a lapping step of removing saw-toothed marks or defects of front and rear surfaces of the wafer 100 and removing stress generated during a cutting step.

Figure 6:
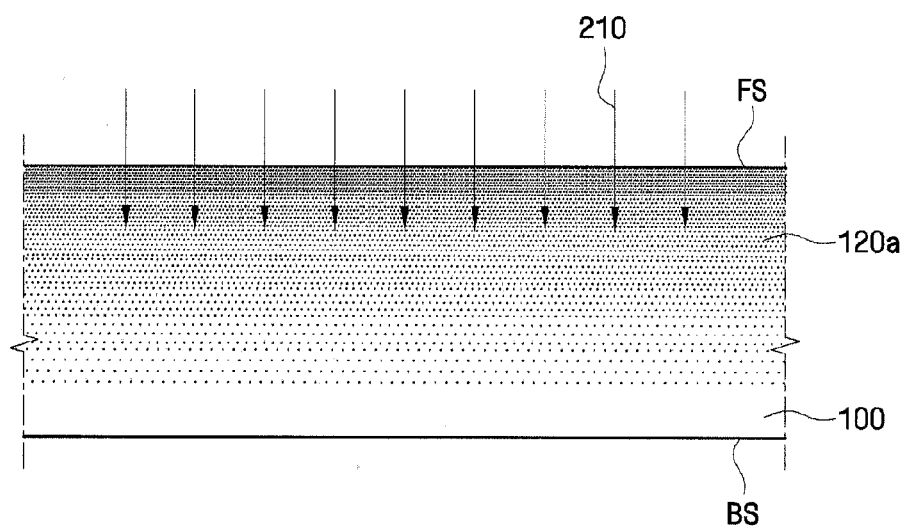
Figure 7:
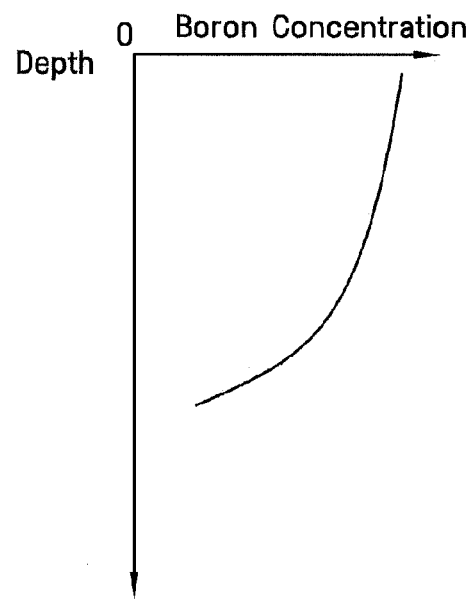

Referring to FIGS. 4, 6 and 7, boron is diffused into the bare wafer 100 through the front surface FS by performing a first thermal process (S120).

In more detail, boron may be diffused into the bare wafer 100 through the first surface by performing a first thermal process using a first gas containing boron. For example, the first thermal process may be performed by providing a $B_2H_6$ gas on the front surface FS of the bare wafer 100 at a temperature in a range of about 800° C. to about 1000° C. for about 30 minutes to about 1 hour. Accordingly, the boron 210 passing through the front surface FS may be diffused inward into the bare wafer 100.

As described above, during the first thermal process, a silicon bonding force of a gas containing hydrogen as a first gas, for example, a $B_2H_6$ gas, becomes weak due to hydrogen, thereby improving boron diffusivity. Accordingly, boron can be diffused into a relatively deep region of the bare wafer 100. That is to say, as shown in FIG. 6, the preliminary high-concentration boron layer 120a may be formed to have a relatively large thickness from the front surface FS.

As shown in FIG. 6, the closer to the first surface, that is, the front surface FS of the bare wafer 100, the higher the boron concentration. That is to say, as shown in FIG. 7, the deeper from the front surface of the bare wafer 100, the smaller the boron concentration. The reason of the foregoing is that as the gas is supplied to the front surface FS of the bare wafer 100 and the first thermal process is performed, boron 210 is diffused inward from the front surface FS.

Figure 8:
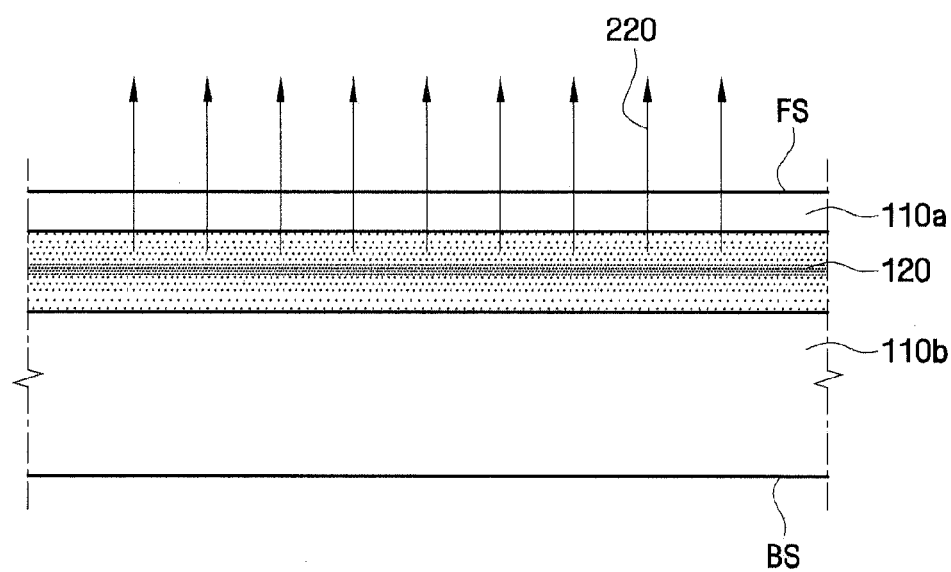
Figure 9:
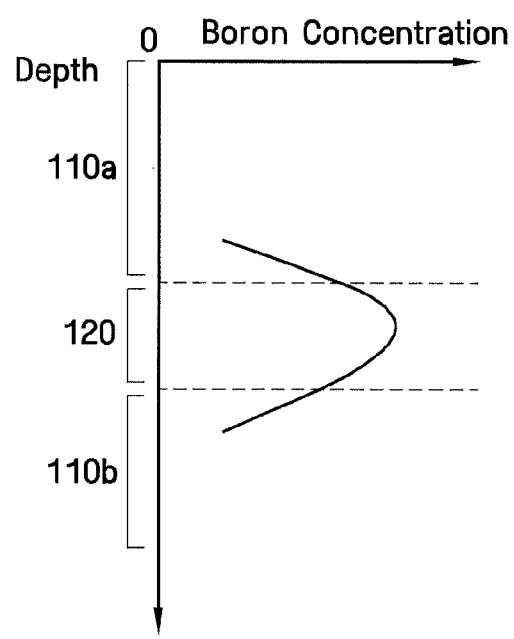

Boron present close to the front surface FS is diffused outward by performing a second thermal process with reference to FIGS. 4, 8 and 9 (S130).

For example, the second thermal process may be performed at a temperature in a range of about 900° C. to about 1200° C. for about 30 minutes to about 1 hour. Accordingly, boron 220 concentrations of the front surface FS of the bare wafer 100 and a region close to the front surface FS may be diffused outward into the bare wafer 100, thereby forming a high-concentration boron layer 120 in the bare wafer 100.

Here, the high-concentration boron layer 120 has a depth of about 3 to 10 μm from the front surface FS, and a boron concentration, that is, the number of boron particles is greater than or equal to about $1\times10^{17}/cm^3$, for example, in a range of about $1\times10^{18}/cm^3$ to about $1\times10^{19}/cm^3$.

In other words, as the result of the first the mal process, the boron concentration becomes higher toward the front surface FS of the bare wafer 100. However, as the result of the second thermal process, as boron present close to the front surface FS is out-diffused, the boron concentration of the front surface FS was reduced. That is to say, as the result of the second thermal process, the boron concentration has a peak value in the high-concentration boron layer 120.

In view of the peak value in boron concentration, when the first thermal process is performed, the peak value is demonstrated on the front surface FS of the bare wafer 100. However, once the second thermal process is performed, the peak value exists inside the high-concentration boron layer 120. That is to say, the peak value exists inside the wafer 100, specifically, in a region close to the front surface FS of the wafer 100 rather than the back surface BS.

Although not shown, after performing the first or second thermal process, the front surface FS may further be polished. In more detail, a surface of the bare wafer 100 may be damaged by processes performed to form the high-concentration boron layer 120. Therefore, after performing the thermal process, at least one surface of the bare wafer 100, for example, the front surface FS, may be polished, thereby reducing defects remaining on the surface of the wafer 100. That is to say, the reliability of the device can be improved.

The polishing may be performed by, for example, chemical mechanical polishing (CMP), specifically a mirror surface polishing process. Such a polishing process may be performed once after performing the first thermal process. Alternatively, the polishing process may be performed once after performing the second thermal process. Alternatively, after performing the first and second thermal processes, each of the CMP and the mirror surface polishing processes may be performed once.

The polishing process may remove a damaged layer including a portion of a surface of the wafer 100, that is, the front surface FS. Here, the damaged layer may be about 1 μm. In consideration of the thermal processing characteristic and the surface planarity and precision of a target wafer, polishing processing conditions, including processing numbers, thickness, intensity and the like, can be determined.

Figure 10:
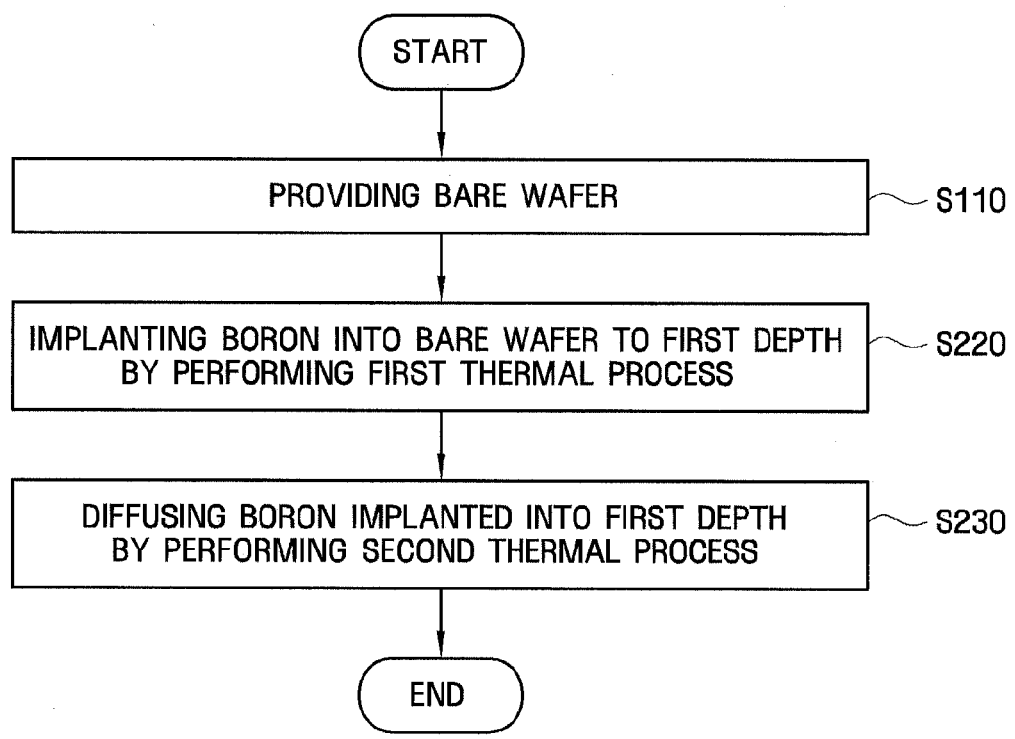
FIG. 10 is a flowchart for explaining a fabricating method of a wafer according to another example embodiment.

Hereinafter, a fabricating method of a wafer according to another example embodiment will be described in detail with reference to FIGS. 10 through 14. FIG. 10 is a flowchart for explaining a fabricating method of a wafer according to another example embodiment, and FIGS. 11 through 14 are a cross-sectional view of an intermediate product for explaining the fabricating method of a wafer according to another example embodiment and graphs illustrating a change in the impurity concentration depending on depths of the wafer.

The fabricating method of a wafer according to the illustrated example embodiment is distinguished from the previous fabricating method in that a high-energy boron ion implantation process is performed during a first thermal process. For the convenience of explanation, substantially the same components as those of the previous embodiments are not described in detail or briefly described.

Teferring to FIG. 10 together with FIG. 5, a plurality of bare wafers are provided by cutting (S110). This step is substantially the same as step S110 of the first example embodiment, and a detailed description thereof will not be given.

Figure 11:
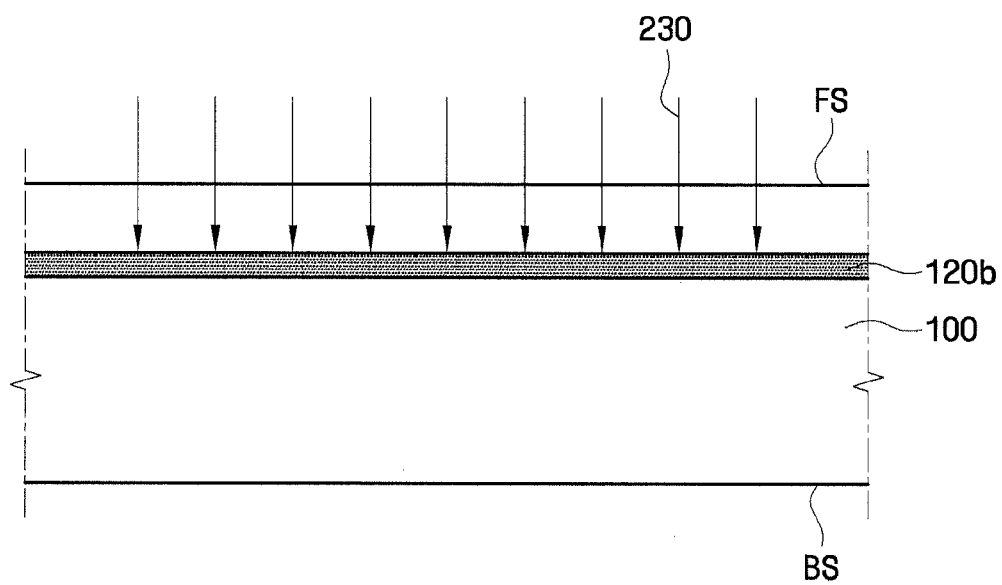
FIGS. 11 through 14 are a cross-sectional view of an intermediate product for explaining the fabricating method of a wafer according to another example embodiment and graphs illustrating a change in the impurity concentration depending on depths of the wafer.
Figure 12:
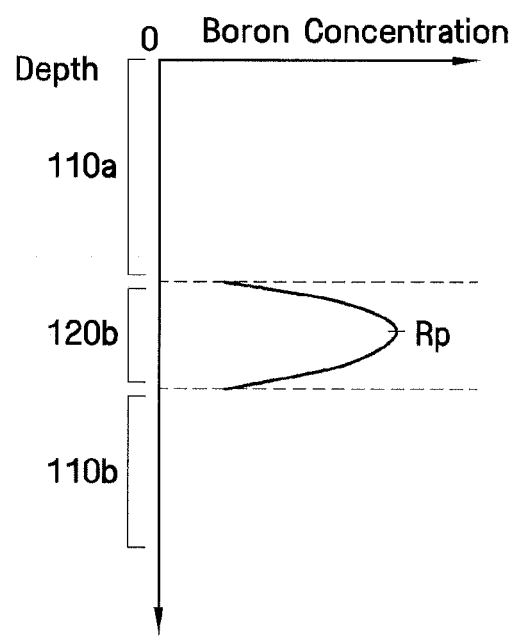

Referring to FIGS. 10 through 12, boron is implanted from the front surface FS of the bare wafer 10 to a first depth by performing a first thermal process (S220).

More specifically, a high-energy boron ion implantation process is performed in the first thermal process for boron implantation to reach the first depth through the front surface FS. Accordingly, a preliminary high-concentration boron layer 120b having a first boron concentration is formed in the bare wafer 100 to a first thickness. Here, the first thickness of the preliminary high-concentration boron layer 120b is smaller than a thickness of a high-concentration boron layer 120 to be described later. A peak value in the boron concentration of the preliminary high-concentration boron layer 120b may be larger than that of the high-concentration boron layer 120.

For example, the high-energy boron ion implantation process may be performed on the front surface FS of the bare wafer 100 with the intensity of about 15 to about 50 MeV in an ion concentration in a range of about $1\times10^{15}$ to about $5\times10^{15}$ atom/$cm^2$, which are, however, provided only for illustration and may be applied in various ranges according to the thickness of the preliminary high-concentration boron layer 120b and the boron concentration.

As shown in FIG. 11, boron 230 is implanted to the front surface FS of the wafer 100 having a first boron concentration into a first depth to have a first thickness by performing a high-energy boron ion implantation process, thereby forming a preliminary high-concentration boron layer 120b.Here, the preliminary high-concentration boron layer 120b has boron more concentrated than the high-concentration boron layer 120. In other words, the preliminary high-concentration boron layer 120b may have a smaller thickness and a higher boron concentration than the high-concentration boron layer 120.

As shown in FIG. 12, the peak value (Rp) in the boron concentration of the preliminary high-concentration boron layer 120b is relatively high and the boron concentration thereof also sharply changes. In other words, compared to the high-concentration boron layer 120, the preliminary high-concentration boron layer 120b has highly concentrated boron in a relatively narrow region.

Figure 13:
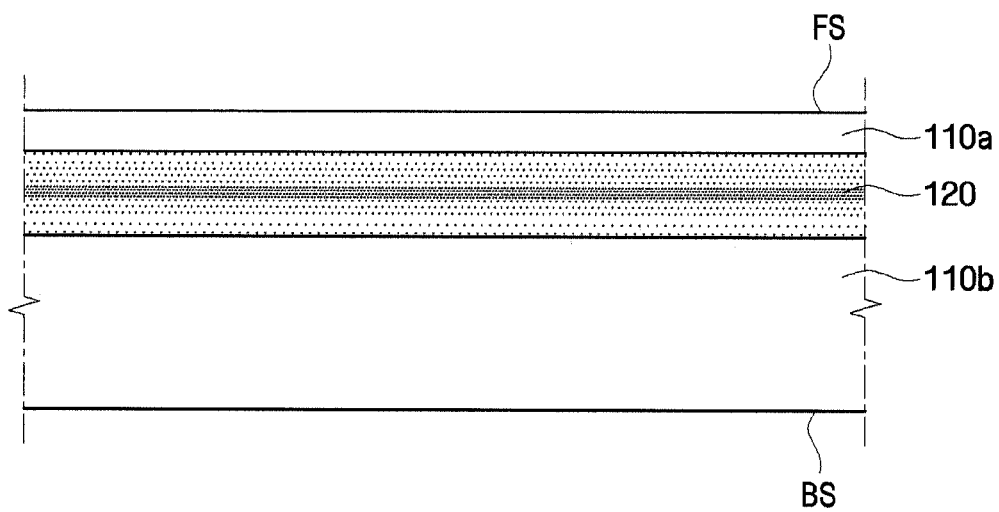
Figure 14:
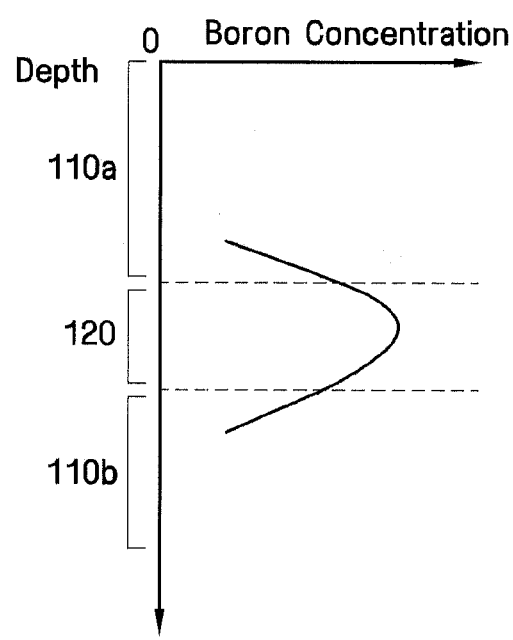

Referring to FIGS. 10, 13 and 14, the boron implanted into the first depth is diffused by performing a second thermal process (S230).

In more detail, the boron distributed in the preliminary high-concentration boron layer 120b can be diffused by performing the second thermal process. Accordingly, the high-concentration boron layer 120 having a thickness greater than that of the preliminary high-concentration boron layer 120b can be formed. The second thermal process may be, for example, annealing.

The second thermal process may be performed at a temperature in a range of about 800 to about 1250° C. for several tens of hours, for example. Accordingly, the surface of the wafer 100 damaged by the high-energy ion implantation process can be cured. In other words, during the second thermal process, the damaged surface of the wafer 100 can be cured while diffusing the boron distributed in the preliminary high-concentration boron layer 120b into surrounding regions.

As shown in FIG. 13, the boron contained in the preliminary high-concentration boron layer 120 is diffused into the surrounding area by the second thermal process. Accordingly, the peak value (Rp) of the boron concentration is lowered. Additionally, the high-concentration boron layer 120 may be formed over a thicker area then the preliminary high-concentration boron layer 120b as shown in FIG. 11. Further, the high-concentration boron layer 120 may be formed at a depth of about 3 to 10 µm from the front surface FS.

As described above, like in the previous fabricating method, in the fabricating method according to the illustrated example embodiment, after performing the first or second thermal process, the front surface FS may further be polished. In more detail, a surface of the bare wafer 100 may be damaged by processes performed to form a high-concentration boron layer 120. Therefore, at least one surface of the bare wafer 100, for example, the front surface FS, may be polished, thereby reducing defects remaining on the surface of the wafer 100. That is to say, the reliability of the device can be improved. Since the polishing process is substantially the same as above, a detailed description thereof will not be given.

As described above, in the fabricating methods according to some example embodiments, boron is injected into a bare wafer by a first thermal process, and a high-concentration boron layer closer to a first surface than to a second surface is formed by a second thermal process, thereby preventing or reducing oxygen from being diffused into the front surface of the wafer in the course of a semiconductor device. Accordingly, the semiconductor device having improved reliability can be fabricated. Further, the high-concentration boron layer has gettering capability for metal ions in the wafer, thereby reducing defects of the semiconductor device. That is to say, the device reliability can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A wafer comprising:
    a first substrate layer formed at a first surface;
    a second substrate layer formed at a second surface opposite to the first surface, the second substrate layer having a greater oxygen concentration than the first substrate layer; and
    an oxygen diffusion protecting layer formed between the first substrate layer and the second substrate layer, the oxygen diffusion protecting layer being located closer to the first surface than to the second surface.

2. The wafer of claim 1, wherein the oxygen diffusion protecting layer is a high-concentration boron layer.

3. The wafer of claim 2, wherein a first boron concentration of the high-concentration boron layer is higher than a second boron concentration of the first substrate layer and a third boron concentration of the second substrate layer.

4. The wafer of claim 1, wherein a first copper concentration of the oxygen diffusion protecting layer is higher than a second copper concentration of the first substrate layer and a third copper concentration of the second substrate layer.

5. The wafer of claim 1, wherein a thickness of the first substrate layer is smaller than that of the second substrate layer.

6. The wafer of claim 1, wherein the oxygen diffusion protecting layer is formed to a depth of about 3 to 10 µm from the first surface.

7. The wafer of claim 1, wherein the first surface includes a surface on which an active region of an integrated circuit device is formed.

8. A wafer comprising:
    a first substrate layer formed at a first surface on which an active region of an integrated circuit device is formed;
    a second substrate layer formed at a second surface opposite to the first surface, the second substrate layer having a greater thickness than the first substrate layer; and
    a high-concentration boron layer formed between the first substrate layer and the second substrate layer.

9. The wafer of claim 8, wherein the high-concentration boron layer is formed to a depth of 3 to 10 µm from the first surface.

10. The wafer of claim 8, wherein an oxygen concentration of the first substrate layer is lower than that of the second substrate layer.

11. The wafer of claim 8, wherein a first boron concentration of the high-concentration boron layer is higher than a second boron concentration of the first substrate layer and a third boron concentration of the second substrate layer.

12. The wafer of claim 8, wherein a first copper concentration of the high-concentration boron layer is higher than a second copper concentration of the first substrate layer and a third copper concentration of the second substrate layer.

13. A wafer comprising:
    an oxygen diffusion protecting layer formed in a substrate having a first surface on which an integrated circuit device is formed, and a second surface opposite to the first surface,
    the substrate having an oxygen concentration that is greater between the oxygen diffusion protecting layer and the second surface of the substrate than between the oxygen diffusion protecting layer and the first surface of the substrate.

14. The wafer of claim 13, wherein the oxygen diffusion protecting layer is a high-concentration boron layer.

15. The wafer of claim 14, wherein a concentration of boron ions is higher in the high-concentration boron layer than a concentration of boron ions in the substrate.

16. The wafer of claim 13, wherein a concentration of copper ions is higher in the oxygen diffusion protecting layer than a concentration of copper ions in the substrate.

17. The wafer of claim 13, wherein a distance between the oxygen diffusion protecting layer and the first surface is less than a distance between the oxygen diffusion protecting layer and the second surface.

18. The wafer of claim 13, wherein the oxygen diffusion protecting layer is formed to a depth of about 3 to 10 μm from the first surface.

* * * * *